(12) United States Patent
Morita

(10) Patent No.: US 11,276,610 B2
(45) Date of Patent: Mar. 15, 2022

(54) WIRING BOARD AND METHOD OF MANUFACTURING THE SAME

(71) Applicant: FUJITSU LIMITED, Kawasaki (JP)

(72) Inventor: Masaru Morita, Isehara (JP)

(73) Assignee: FUJITSU LIMITED, Kawasaki (JP)

( * ) Notice: Subject to any disclaimer, the term of this patent is extended or adjusted under 35 U.S.C. 154(b) by 262 days.

(21) Appl. No.: 16/808,847

(22) Filed: Mar. 4, 2020

(65) Prior Publication Data
US 2020/0343133 A1 Oct. 29, 2020

(30) Foreign Application Priority Data
Apr. 26, 2019 (JP) .............................. JP2019-085437

(51) Int. Cl.
*H05K 1/09* (2006.01)
*H01L 21/768* (2006.01)
*H05K 3/10* (2006.01)
*H05K 3/38* (2006.01)
*H05K 3/24* (2006.01)
*H05K 3/28* (2006.01)
*H05K 3/46* (2006.01)

(52) U.S. Cl.
CPC .. *H01L 21/76843* (2013.01); *H01L 21/76852* (2013.01); *H01L 21/76885* (2013.01); *H05K 1/09* (2013.01); *H05K 3/10* (2013.01); *H05K 3/244* (2013.01); *H05K 3/28* (2013.01); *H05K 3/388* (2013.01); *H01L 2221/1078* (2013.01); *H05K 3/108* (2013.01); *H05K 3/4661* (2013.01); *H05K 2201/0338* (2013.01); *H05K 2203/072* (2013.01)

(58) Field of Classification Search
CPC ............ H05K 1/09; H05K 3/10; H05K 3/244; H05K 3/28; H05K 2201/0338
USPC ......................................................... 174/257
See application file for complete search history.

(56) References Cited

U.S. PATENT DOCUMENTS

| | | | |
|---|---|---|---|
| 6,515,372 B1* | 2/2003 | Narizuka | ................ H01L 24/13 257/779 |
| 2004/0185683 A1* | 9/2004 | Nakamura | ........ H01L 21/76843 438/125 |
| 2007/0020931 A1 | 1/2007 | Koura et al. | |
| 2010/0044085 A1* | 2/2010 | Nakamura | ........ H01L 21/76843 174/257 |

FOREIGN PATENT DOCUMENTS

| | | |
|---|---|---|
| JP | 2004-304167 A | 10/2004 |
| JP | 2007-27259 A | 2/2007 |

* cited by examiner

*Primary Examiner* — Sherman Ng
(74) *Attorney, Agent, or Firm* — Fujitsu Patent Center

(57) ABSTRACT

A wiring board includes a wiring layer; a diffusion suppressing layer that covers the wiring layer and suppresses diffusion of a metal component of the wiring layer; a base metal layer that covers the diffusion suppressing layer; and a passivation layer that covers the base metal layer.

6 Claims, 10 Drawing Sheets

WIRING BOARD AND METHOD OF MANUFACTURING THE SAME

CROSS-REFERENCE TO RELATED APPLICATION

This application is based upon and claims the benefit of priority of the prior Japanese Patent Application No. 2019-85437, filed on Apr. 26, 2019, the entire contents of which are incorporated herein by reference.

FIELD

The embodiment discussed herein is related to a wiring board and a method of manufacturing the same.

BACKGROUND

In recent years, semiconductor elements and circuit boards are bonded to each other via wiring boards including fine wiring lines having a small wiring width, so that the semiconductor elements are densely mounted and thus a semiconductor device may be made highly functional.

In many cases, the wiring board includes a wiring layer made of a conductive metal, a resin layer that is provided around the wiring layer, for protecting wiring from corrosion, mechanical impact, and the like from the outside, and a barrier metal layer for suppressing thermal diffusion and disappearance of a metal component of the wiring layer into the resin layer due to heating of the wiring board and thus suppressing decrease in the reliability.

Recently, it has been proposed to use, for example, an electroless nickel-phosphorus (Ni—P) plating film or an electroless nickel-boron (Ni—B) plating film as the barrier metal layer. As the barrier metal layer, for example, there has been proposed a method in which an alloy containing a metal of the wiring layer is provided over the surface of the wiring layer, and an oxide film of the alloy is provided over the surface of the alloy. For example, Japanese Laid-open Patent Publication No. 2004-304167 and Japanese Laid-open Patent Publication No, 2007-27259 are disclosed as the related art.

However, in the case of a wiring board including a barrier metal layer of related art, there is a problem that the wiring board is heated due to heat generation of an electronic device or by being left in a high temperature in, a reliability test, thus the wiring resistance increases, and the reliability of the ring decreases. In view of the above, it is desirable to be able to suppress the crease in the resistance of the wiring.

SUMMARY

According to an aspect of the embodiments, a wiring board includes a wiring layer; a diffusion suppressing layer that covers the wiring layer and suppresses diffusion of a metal component of the wiring layer; a base metal layer that covers the diffusion suppressing layer; and a passivation layer that covers the base metal layer.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Figure 1A:
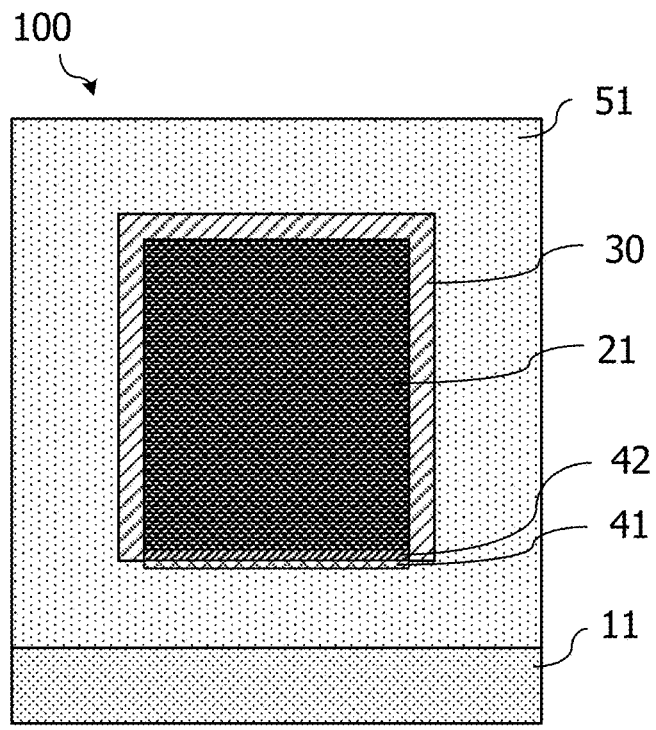
FIG. 1A is a schematic diagram (part 1) illustrating an example of a cross section of wiring in a wiring board of related art.
Figure 1B:
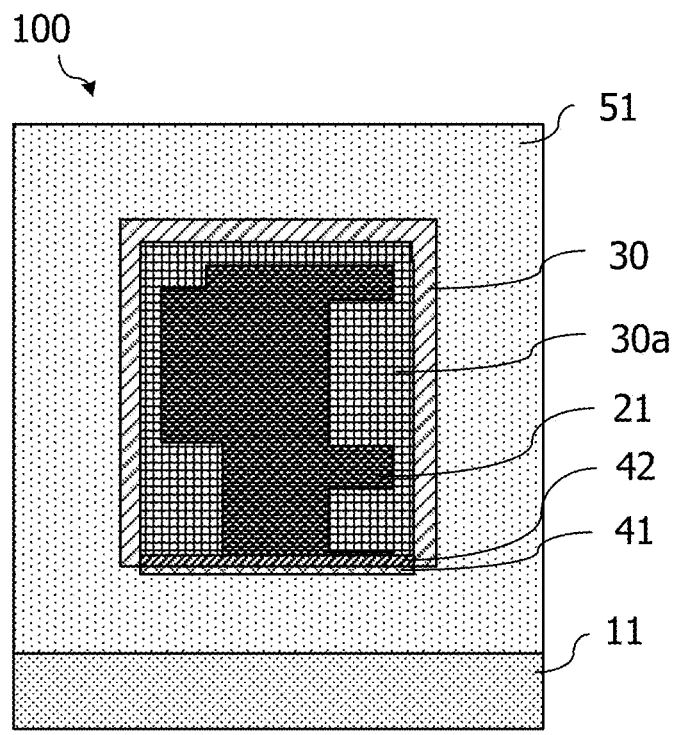
FIG. 1B is a schematic diagram (part 2) illustrating another example of a cross section of wiring in a wiring board of related art.
Figure 1C:
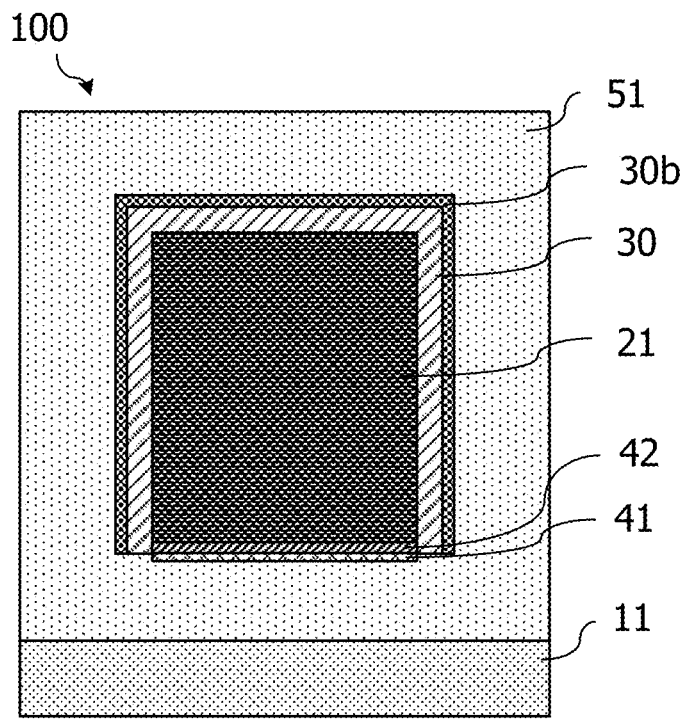
FIG. 1C is a schematic diagram (part 3) illustrating another example of a cross section of wiring in a wiring board of related art.

As a result of extensive studies by the inventors, it has been found that there is a problem that, in a wiring board including a barrier metal layer of related art such as Ni—P, a metal component of the wiring layer and a metal component of the barrier metal layer may thermally diffuse to each other, and the wiring layer in wiring may be reduced to increase the wiring resistance (see, for example, 30a of FIG. 18). There is also a problem that, in a wiring board including a barrier metal layer of related art such as Ni—P, the thickness of an oxide film formed over the surface of the barrier metal layer increases due to heating, and thus the wiring layer in wiring may be reduced to increase the wiring resistance (see, for example, 30b of FIG. 1C).

In a wiring board of related art including, as the barrier metal layer, an alloy layer containing the same metal as the wiring, layer and a film of oxide thereof, for example, in a reliability test of the wiring board in a high-temperature and high-humidity environment such as a high accelerated stress test (HAST), there is a problem that, as illustrated in FIG. ID, a wiring layer 21 penetrates through a barrier metal layer 30 and diffuses into a resin layer, so that a current leakage between adjacent wiring lines (not illustrated) occurs and it is difficult to secure reliability.

These problems appear more pronounced as the wiring width is reduced.

On the contrary, it has been found that by providing a diffusion suppressing layer that suppresses diffusion of a metal component of a wiring layer, a base metal layer, and a passivation layer around the wiring layer, diffusion of the metal component of the wiring layer, increase in the thickness of an oxide film formed over a surface of a barrier metal layer, and penetration of the wiring layer may be suppressed, and thus the technique of the present disclosure has been completed.

(Wiring Board)

The disclosed wiring board includes wiring over a substrate, the wiring including a wiring layer, a diffusion suppressing layer covering the wiring layer and suppressing diffusion of a metal component of the wiring layer, a base metal layer covering the diffusion suppressing layer, and a passivation layer covering the base metal layer, and includes, if necessary, a resin layer, an adhesion layer, a power supply layer, and other layers.

The disclosed wiring board may have a single-layer structure or a multilayer structure (multilayer wiring board).

Wiring Layer

The wiring layer is fir ng arranged over a surface of the substrate.

Regarding the size of the wiring layer, the wiring layer preferably has a width of 2.0 μm or less, more preferably 1.0 μm or less, and still more preferably 0.8 μm or less. When the width of the wiring layer is 2.0 μm or less, the circuit board may be miniaturized, and the semiconductor device to which the circuit board is applied may be miniaturized. The average thickness (height) of the wiring layer is not limited as long as the thickness is such a value that the function of the layer is obtained, may be appropriately selected according to the purpose, and is, for example, 0.5 μm or more and 2.0 μm or less. The average thickness (height) of the wiring layer may be obtained as an average of the thickness (height) of the wiring layer in 10 or more points (positions) in an image obtained by photographing the cross section of the wiring board in a direction orthogonal to the plane direction thereof.

The shape of the wiring layer is not limited and may be appropriately selected according to the purpose. For example, a cross section orthogonal to the longitudinal direction may be a substantially square shape.

The material of the wiring layer is not limited. Examples of the material include metals such as copper, chromium, nickel, zinc, aluminum, cobalt, gold, platinum, silver, and palladium. Among these, copper, gold, silver, and the like are preferable for the high conductivity thereof.

Diffusion Suppressing Layer

The diffusion suppressing layer is a layer covering the wiring layer and suppressing diffusion of a metal component of the wiring layer.

The degree to which the wiring layer covers the diffusion suppressing layer may be such a degree that diffusion of the material of the wiring layer is suppressed. Although the diffusion suppressing layer may be completely coated or partially coated, it is preferable that the diffusion suppressing layer is completely coated.

The average thickness of the diffusion suppressing layer is not limited as long as the thickness is such a value that the function of the layer is obtained, and may be appropriately selected according to the purpose. For example, the thickness is preferably 20 nm or more and 60 nm or less. The average thickness (height) of the diffusion suppressing layer may be obtained as an average of the thickness (height) of the diffusion suppressing layer in 10 or more points (positions) in an image obtained by photographing the cross section of the wiring board in a direction orthogonal to the plane direction thereof.

A material of the diffusion suppressing layer is not limited as long as diffusion of the material of the wiring layer is suppressed. For example, the material is preferably an alloy containing a metal component of the wiring layer. By forming the diffusion suppressing layer from an alloy containing a metal component of the wiring layer, the state of the diffusion suppressing layer may be stabilized, diffusion of the metal component of a layer provided around the wiring layer into the wiring layer caused by heat may be suppressed, and thus increase in the resistance of the wiring may be suppressed.

As specific examples of the material of the diffusion suppressing layer, for example, when the material of the wiring layer is copper, an alloy of gold and copper (Au—Cu), an alloy of copper and tin (Cu—Sn), an alloy of indium and copper (In—Cu), an alloy of silver and copper (Ag—Cu), and the like may be suitably used.

The composition ratio of the alloy is not limited as long as the function as the diffusion suppressing layer is obtained and may be appropriately selected according to the purpose.

Base Metal Layer

The base metal layer a layer covering the diffusion suppressing layer.

The average thickness of the base metal layer is not limited as long as the thickness is of a value sufficient to maintain the strength without degrading the function of the wiring, and may be appropriately selected according to the purpose. The average thickness of the base metal layer is preferably, for example, 20 nm or more and 80 nm or less. The average thickness (height) of the base metal layer may be obtained as an average of the thickness (height) of the base metal layer in 10 or more points (positions) in an image obtained by photographing the cross section of the wiring board in a direction orthogonal to the plane direction thereof.

The material of the base metal layer is not limited as long as a base metal is contained, and there is no limitation according to the purpose. The material of the base metal layer is, for example, chromium (Cr), cobalt (Co), cobalt-boron (Co—B), cobalt-tungsten (Co—W), or the like.

When the material of the base metal layer contains either chromium (Cr) or cobalt (Co), a base metal layer having high hardness may be formed, so that penetration of the material of the wiring may be suppressed, and the strength of the barrier metal layer against the reliability test may be improved. When either chromium (Cr) or cobalt (Co) is contained, since the metals are each a very stable metal having a melting point of 1,500° C. or more, diffusion of the metal of the base metal layer into the diffusion suppressing layer and the wiring layer may be suppressed even when the reliability test is performed at about 260° C. Therefore, increase in the resistance of the wiring may be suppressed.

Passivation Layer

The passivation layer is a layer which covers the base metal layer and whose state is hard to change over time or according to environmental conditions.

The passivation layer preferably an oxide (film) of the base metal formed by oxidizing the surface of the base metal layer.

The oxide of the base metal is not limited as long as the oxide is stable in a heating condition of about 260° C. For example, when the material of the base metal layer is a metal containing chromium (Cr), chromium (III) oxide ($Cr_2O_3$) or the like may be used. When the material of the base metal layer is a metal containing cobalt (Co), cobalt (II) oxide (CoO) or the like may be used. As a result of the passivation layer being formed from an oxide of the base metal, the average thickness of the passivation layer does not change when the wiring board is heated in the reliability test or the like, and thus increase in the resistance of the wiring due to increase in the thickness of the oxide film may be suppressed.

The average thickness of the passivation layer is not limited as long as the thickness is such a value that the function of the layer is obtained, and may be appropriately selected according to the purpose. The average thickness of the passivation layer is, for example, about several tens of angstroms (several nm). The passivation layer may be observed and analyzed by, for example, a transmission electron microscope (TEM).

Figure 1D:
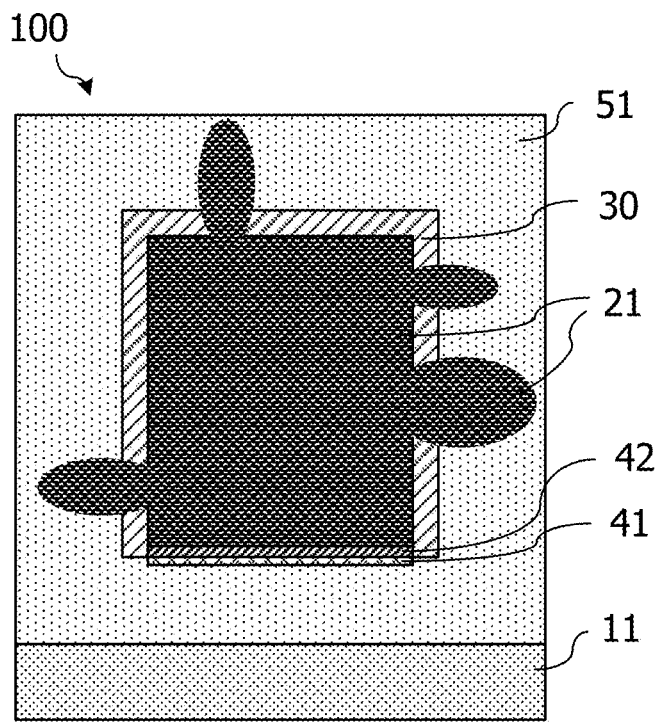
FIG. 1D is a schematic diagram (part 4) illustrating another example of a cross section of wiring in a wiring board of related art.

In the disclosed technology, the diffusion suppressing layer, the base metal layer, and the passivation layer serve as a barrier metal layer for suppressing diffusion of a metal component of the wiring layer to the surroundings of the wiring layer. In related art, the barrier metal layer is formed by forming a diffusion suppressing layer over the surface (periphery) of the wiring layer, and forming the passivation layer directly over the surface (periphery) of the formed diffusion suppressing layer. The diffusion suppressing layer used herein is hard and brittle, and the passivation layer has an average thickness of about several tens of angstroms. Therefore, the barrier metal layer is very thin and has a low strength. Therefore, in a wiring structure in which the passivation layer is directly formed around the diffusion suppressing layer, there is a possibility that the barrier metal layer is damaged by an impact applied thereto in the reliability test. In the wiring structure in which the passivation layer is directly formed around the diffusion suppressing layer, the wiring layer may penetrate through the barrier metal layer and diffuse into the resin layer in a high-temperature and high-humidity environment (see, for example, FIG. 1D).

In the disclosed technology, the base metal layer covering the diffusion suppressing layer has a strength high enough to withstand an impact applied in the reliability test. Therefore, damage to the barrier metal layer may be suppressed, and increase in the resistance of the wiring may be suppressed. Therefore, the wiring board of the present disclosure may ensure high reliability.

For example, in the case where miniaturization is performed such that the wiring width is 2.0 μm or less, by providing the disclosed layer, structure over the wiring layer, the increase in the resistance of the wiring may be suppressed even when the wiring board is heated. The width of the wiring is preferably 2.0 μm or less, more preferably 1.0 μm, still more preferably 0.6 μm or less, and most preferably 0.5 μm or less.

For example, the average thickness of the barrier metal layer (diffusion suppressing layer, base metal layer, and passivation layer) is preferably 120 nm or less, more preferably 100 nm or less, still more preferably 90 nm or less, and further preferably 60 nm or less. The average thickness (height) of the barrier metal layer may be obtained as an average of the thickness (height) of the barrier metal layer in 10 or more points (positions) in an image obtained by photographing the cross section of the wiring board in a direction orthogonal to the plane direction thereof.

Substrate

The substrate is a plate-like member over which the wiring is to be, formed.

The size and shape of the substrate are not limited as long as the size and shape are similar to those of a substrate used in a wiring board of related art or the like, and may be appropriately selected according to the purpose.

The material of the substrate is not limited as long as the material is similar to that of a substrate used in a wiring board of related art or the like, and may be appropriately selected according to the purpose. The material of the substrate is, for example, silicon, resin, ceramic, glass, or the like.

Examples of the material of the resin include polyimide resin, epoxy resin, bismaleimide resin, maleimide resin, cyanate resin, phenolic resin, novolac resin, acrylic resin, methacrylic resin, polyphenylene ether resin, polyphenylene oxide resin, olefin resin, fluorine-containing resin, liquid crystal polymer, polyether imide resin, and polyether ether ketone resin. Among these, one kind may be used alone, or two or more kinds may be used in combination.

It is preferable that a resin layer is formed over the surface of the substrate as a base layer or so as to cover the wiring.

Resin Layer

The resin layer is a layer covering the surface of the substrate and the wiring.

As a material for the resin layer, a resin material used often may be used as long as the material is capable of exhibiting a function of protecting the wiring from corrosion or mechanical impact from the outside, thus the resin material is not limited and may be appropriately selected according to the purpose. Examples of the material of the resin layer include polyimide resin, polybenzoxazole resin, epoxy resin, bismaleimide resin, maleimide resin, cyanate resin, phenolic resin, novolac resin, acrylic resin, methacrylic resin, polyphenylene ether resin, polyphenylene oxide resin, olefin resin, fluorine-containing resin, liquid crystal polymer, polyether imide resin, and polyether ether ketone resin. Among these, one kind may be used alone, or two or more kinds may be used in combination.

Adhesion Layer

The adhesion layer is provided over the resin layer and has a function of causing the wiring layer and the resin layer to firmly adhere to each other and a function as a barrier metal layer for suppressing diffusion of a metal component from the wiring layer to the resin layer.

The size and shape of the adhesion layer may be, for example, size and shape similar to those of the wiring layer. The average thickness of the adhesion layer is not limited as long as the function of the layer is obtained, and may be appropriately selected according to the purpose. The average thickness (height) of the adhesion layer may be obtained as an average of the thickness (height) of the adhesion layer in 10 or more points (positions) in an image obtained by photographing the cross section of the wiring board in a direction orthogonal to the plane direction thereof.

The material of the adhesion layer is not limited as long as the material is excellent in adhesion to the resin layer, is capable of firmly adhering to the metal used for the wiring layer, and is capable of being subjected to plasma etching or wet etching, and may be appropriately selected according to the purpose. The material of the adhesion layer is, for example, titanium (Ti), chromium (Cr), or the like.

Power Supply Layer

The power supply layer is a layer provided to supply electricity from an outer peripheral portion of the substrate when the wiring layer is formed by electroplating.

The size and shape of the power supply layer may be, for example, size and shape similar to those of the wiring layer. The average thickness of the power supply layer is not limited as long as the function of the layer is obtained, and may be appropriately selected according to the purpose. The average thickness (height) of the power supply layer may be obtained as an average of the thickness (height) of the power supply layer in 10 or more points (positions) an image obtained by photographing the cross section of the wiring board in a direction orthogonal to the plane direction thereof.

The material of the power supply layer is not limited as long as a strong oxide film is not formed and the material is capable of being subjected to plasma etching or wet etching, and may be appropriately selected according to the purpose. The material of the power supply layer is, for example, copper (Cu), nickel (Ni), an alloy of nickel and chromium (Ni—Cr), or the like.

An example of the wiring board of the present disclosure will now be described with reference to drawings.

Figure 2:
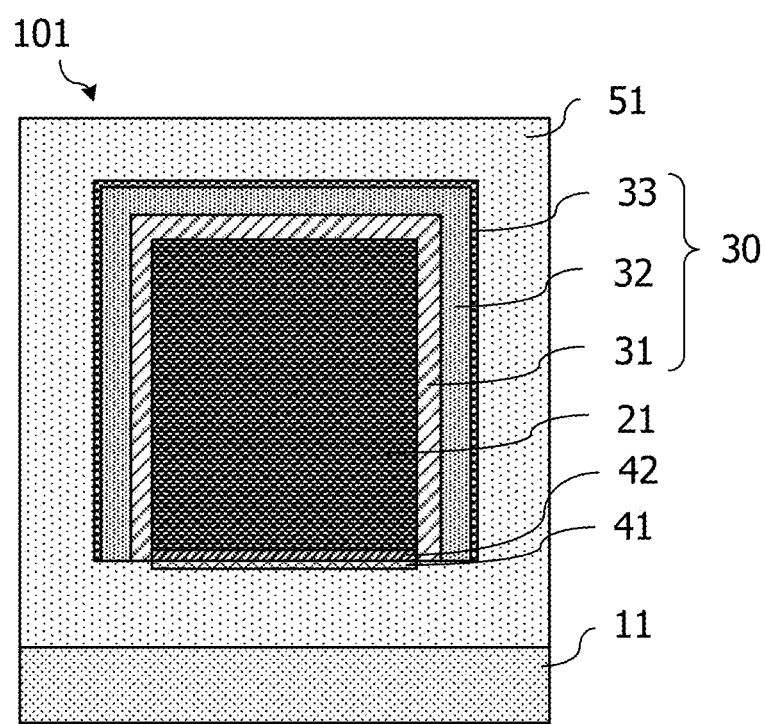
FIG. 2 is a schematic diagram illustrating an example of a cross section of wiring in a wiring board of the present disclosure.

FIG. 2 is a cross-sectional view of an example f wiring of tale wiring board of the present disclosure.

The wiring, of the wiring board illustrated in FIG. 2 includes, over a substrate 11, a wire including, a seed layer including an adhesion layer 41 and a power supply layer 42, the wiring layer 21 over the seed layer, a diffusion suppressing layer 31 covering the wiring layer 21, a base metal layer 32 covering the diffusion suppressing layer 31, and a passivation layer 33 covering the base metal layer 32 in this order, and a resin layer 51 covering the wire. The diffusion suppressing layer 31, the base metal layer 32, and the passivation layer 33 may be referred to as a "barrier metal layer".

(Method of Manufacturing Wiring Board)

A method of manufacturing a wiring board of the present disclosure includes a wiring layer forming step of forming a wiring layer over a substrate, a diffusion suppressing layer of forming a diffusion suppressing layer that covers the wiring layer and suppresses diffusion of a metal component of the wiring layer, a base metal layer forming step of forming a base metal layer that covers the diffusion suppressing layer, and a passivation layer forming step of forming a passivation layer that covers the base metal layer, and further includes other steps if necessary.

The wiring board is a wiring board of the present disclosure.

<Wiring Layer Forming Step>

The wiring layer forming step may include a resin layer forming step of forming a resin layer over a substrate, an adhesion layer forming step of forming an adhesion layer over the resin layer, and a power supply layer forming step of forming a power supply layer over the adhesion layer.

The resin layer forming step is a step of forming the resin layer over the substrate.

Examples of a method of forming the resin layer over the substrate include a method of applying a resin solution or a molten resin over the surface of the substrate and drying and solidifying the resin solution or molten resin, and a method of applying a resin solution or a molten resin to surround the wiring after forming the wiring over the substrate, and drying and solidifying the resin solution or molten resin. Examples of a method for applying the resin solution or molten resin over the substrate include a known spin coating method.

The material and the like of the resin layer are similar to those of the resin layer described for the wiring board of the present disclosure.

The method of applying, drying, and solidifying the resin solution or molten resin and the like is not limited and may be appropriately selected according to the purpose, and it is preferable to perform heat treatment stepwise at temperatures of 70° C. or higher and 300° C. or lower, for example, it is preferable to perform heat treatment at a temperature of 70° C. or higher and 130° C. or lower and then perform heat treatment at one or more steps in a temperature range from 130° C. to 300° C.

The time for applying, drying, and solidifying the resin solution or molten resin and the like may be appropriately selected within a range in which the wiring is not deteriorated, the first treatment is preferably performed for 30 seconds or more and 10 minutes or less, and the stepwise treatment thereafter is preferably performed for 10 minutes or more and 5 hours or less, and the total treatment time is preferably 30 minutes or more and 5 hours or less including time for temperature adjustment.

The atmosphere for applying, drying and solidifying the resin solution or molten resin is not limited and may be appropriately selected according to the purpose, and an inert gas atmosphere is preferable for suppressing oxidation of the resin layer in heat treatment at a temperature of 130° C. or higher. Examples of the inert gas include nitrogen gas.

The adhesion layer forming step is a step of forming the adhesion layer after forming the resin layer over the surface of the substrate.

The material and the like of the adhesion layer are similar to those of the adhesion layer described for the wiring board of the present disclosure.

The adhesion layer is formed to improve the adhesion between the wiring layer to be formed later and the resin layer.

The method of forming the adhesion layer is not limited and lay be appropriately selected according to the purpose, and examples thereof include a method of forming the adhesion layer over the entire surface of the resin layer over the substrate by sputtering or the like.

The power supply layer forming step is a step of forming a power supply layer over the surface of the adhesion layer.

The power supply layer is a layer used to supply electricity from an outer peripheral portion of the substrate when the wiring layer is formed by electroplating.

The material and the like of the power supply layer are similar to those of the power supply layer described for the wiring board disclosed in the disclosure.

The method of forming the power supply layer is not limited and may be appropriately selected according to the purpose, and examples thereof include sputtering and electroless plating.

The wiring layer forming step is a step of or g a wiring layer over the substrate.

Examples of the method of forming the wiring layer over the substrate include a method in which a photoresist is applied over the power supply layer formed over the substrate, a resist wiring pattern is formed by an exposure apparatus or a developing apparatus, then electroplating or the like is performed, and then further the resist pattern over the substrate, an unnecessary power supply layer, and an unnecessary adhesion layer are removed by known wet etching or dry etching.

Regarding the size of the wiring layer, the maximum width in a direction parallel to the substrate in a cross section of the wiring layer (width of wiring layer) is preferably 2.0 μm or less, more preferably 1.0 μm or less, and still more preferably 0.8 μm or less. The width of the wiring layer to be formed may be adjusted by adjusting the width of a recess portion formed in the wiring pattern of the resist described above. When the width of the wiring layer is 2.0 μm or less, the circuit board may be miniaturized, and the semiconductor device to which the wiring is applied may be miniaturized.

The material and the like of the wiring layer are similar to those of the wiring layer described for the wiring board of the present disclosure.

<Diffusion Suppressing Layer Forming Step>

The diffusion suppressing layer forming step is a step of forming a diffusion suppressing layer for suppressing diffusion of a metal component of the wiring layer.

Examples of the method of forming the diffusion suppressing layer include a method in which heat treatment is performed after electroless plating is performed. The treatment time of the electroless plating may be appropriately adjusted so as to obtain a thickness sufficient to exhibit a function as a diffusion suppressing layer. Examples of the material used for the electroless plating include metals such as gold (Au), tin (Sn), indium (In), and silver (Ag).

Examples of conditions of the heat treatment include conditions such as 200° C., nitrogen (low oxygen) atmosphere, and 1 hour. By performing the heat treatment, a metal layer (film) formed over the surface of the wiring layer by the electroless plating is thermally diffused into the wiring layer, thereby forming an alloy with the metal component of the wiring layer. Accordingly, the diffusion suppressing layer which is a layer of an alloy stable against heat may be formed over the surface of the wiring layer by the heat treatment.

<Base Metal Layer Forming Step>

The base metal layer forming step is a step of forming a base metal layer covering the formed diffusion suppressing layer.

Examples of the method of forming the base metal layer covering the formed diffusion suppressing layer include electroless plating. The time for performing the electroless plating may be appropriately adjusted so as to obtain a thickness sufficient to exhibit a function as a base metal layer.

The material and the like of the base metal layer are similar to those of the base metal layer described for the wiring board of the present disclosure.

<Passivation Layer Forming Step>

The passivation layer forming step is a step of forming a passivation layer covering the formed base metal layer.

Examples of a method of forming the passivation layer include a method in which heat (baking) treatment is performed after the base metal layer is formed.

Examples of conditions of the heat treatment include conditions such as 200° C., nitrogen (low oxygen) atmosphere, and 1 hour. By performing the heat treatment, a passivation layer, which is an oxide of a base metal, is formed over a surface layer of the base metal layer.

The material and the like of the passivation layer are similar to those of the passivation layer described for the wiring board of the present disclosure.

Regarding the heat treatment in the diffusion suppressing layer forming step and the passivation layer forming step, a product similar to that of a case where the heat treatment is performed in each step may be obtained by performing the heat treatment after performing the base metal layer forming step without performing the heat treatment in the diffusion suppressing layer forming step, and therefore the heat treatment in the diffusion suppressing layer forming step may be omitted.

The diffusion suppressing layer, the base metal layer, and the passivation layer that are formed serve as a barrier metal layer for the wiring layer.

A resin layer similar to the resin layer provided over the substrate as a base layer may be further provided over the surface (periphery) of the barrier metal layer.

An example of a method of manufacturing a wiring board of the present disclosure will be described with reference to the drawings.

FIGS. 3A to 3I are each a schematic diagram illustrating an example of a process for manufacturing the wiring board of the present disclosure illustrated in FIG. 2, FIGS. 3A to 3I that illustrate an example of a manufacturing method of the wiring board are enlarged views of wiring formed over a substrate.

Figure 3A:
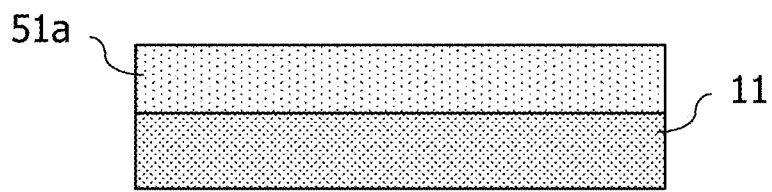
FIG. 3A is a schematic diagram (part 1) illustrating an example of a process in a method of manufacturing a wiring board of the present disclosure.

First, as illustrated in FIG. 3A, a base resin layer 51a is formed over the substrate 11.

Figure 3B:
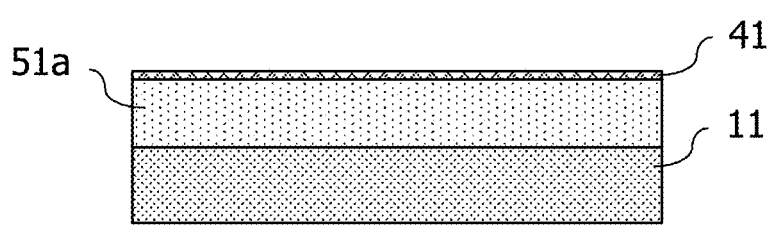
FIG. 3B is a schematic diagram (part 2) illustrating the example of a process in the method of manufacturing a wiring board of the present disclosure.

After the formation of the base resin layer 51a, the adhesion layer 41 is formed over the entire surface of the base resin layer 51a as illustrated in FIG. 3B.

Figure 3C:
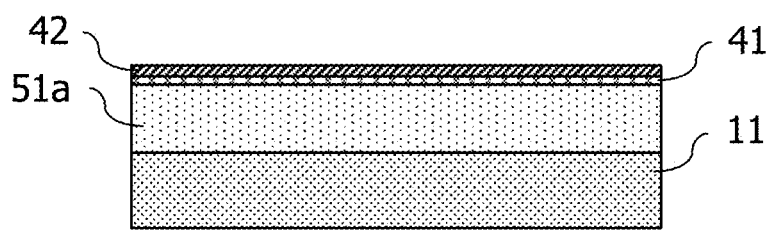
FIG. 3C is a schematic diagram (part 3) illustrating the example of a process in the method of manufacturing a wiring board according to the present disclosure.

After the formation of the adhesion layer 41, the power supply layer 42 is formed over the entire surface of the adhesion layer 41 as illustrated in FIG. 3C.

Figure 3D:
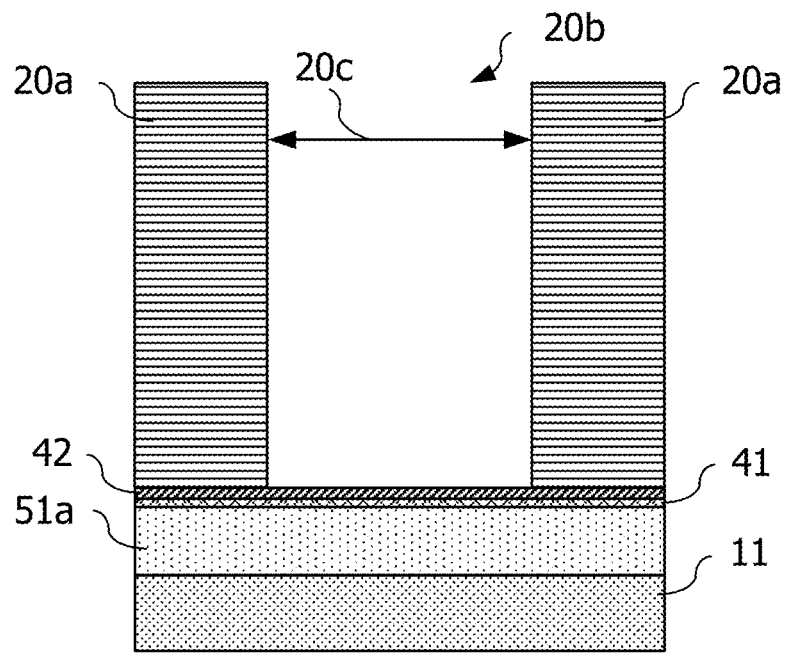
FIG. 3D is a schematic diagram (part 4) illustrating the example of a process in the method of manufacturing a wiring board of the present disclosure.

Next, as illustrated in FIG. 3D, a photoresist film is formed over the power supply layer 42, and the photoresist film is exposed and developed to form a resist pattern (wiring pattern) 20a having a desired shape including an opening portion 20b through which the surface of the power supply layer 42 is exposed. At, this time, by adjusting a width 20c of the opening portion 20b (width of the wiring layer) in the resist pattern 20a to be formed, it is possible to adjust the width of the wiring layer 21 to be formed later.

Figure 3E:
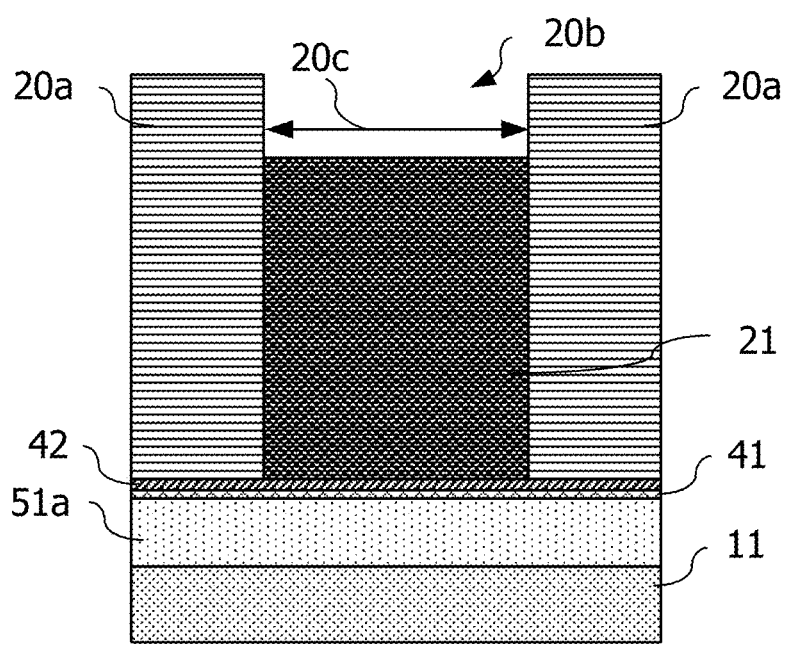
FIG. 3E is a schematic diagram (part 5) illustrating the example of a process in the method of manufacturing a wiring board according to the present disclosure.
Figure 3F:
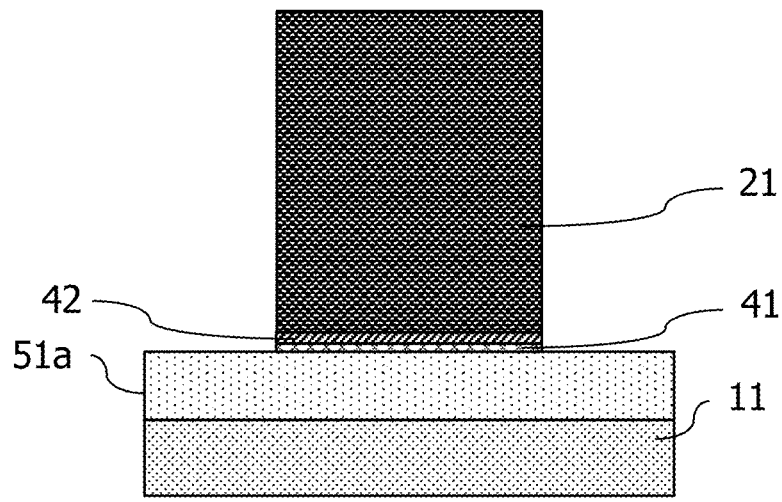
FIG. 3F is a schematic diagram (part 6) illustrating the example, of a process in the method of manufacturing a wiring board of the present disclosure.

Next, as illustrated in FIG. 3E, the wiring layer 21 is formed over the power supply layer 42 inside the opening portion 20b by a known electroplating method. Then, as illustrated in FIG. 3F, the resist pattern 20a, and the adhesion layer 41 and the power supply layer 42 that are not covered by the wiring layer 21 are removed by etching.

Figure 3G:
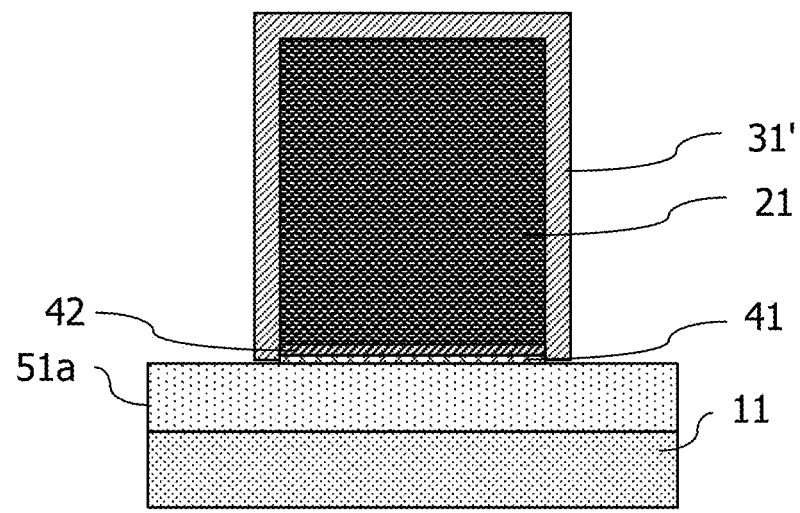
FIG. 3G is a schematic diagram (part 7) illustrating the example of a process in the method of manufacturing a wiring board of the present disclosure.

Next, as illustrated in FIG. 3G, the surface of the wiring layer 21 is subjected to electroless plating using a metal such as gold (Au) or tin (Sn) that serves as a material of the diffusion suppressing layer to form an electroless plating film 31'.

Figure 3H:
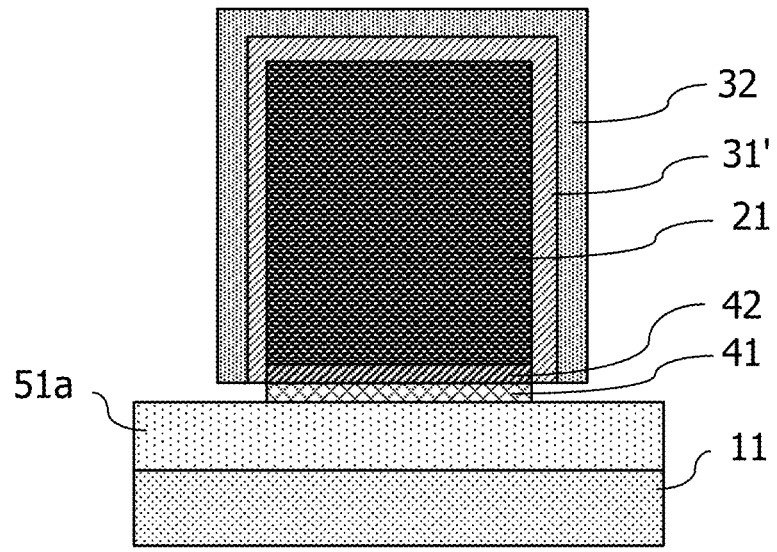
FIG. 3H is a schematic diagram (part 8) illustrating the example of a process in the method of manufacturing a wiring board of the present disclosure.
Figure 3I:
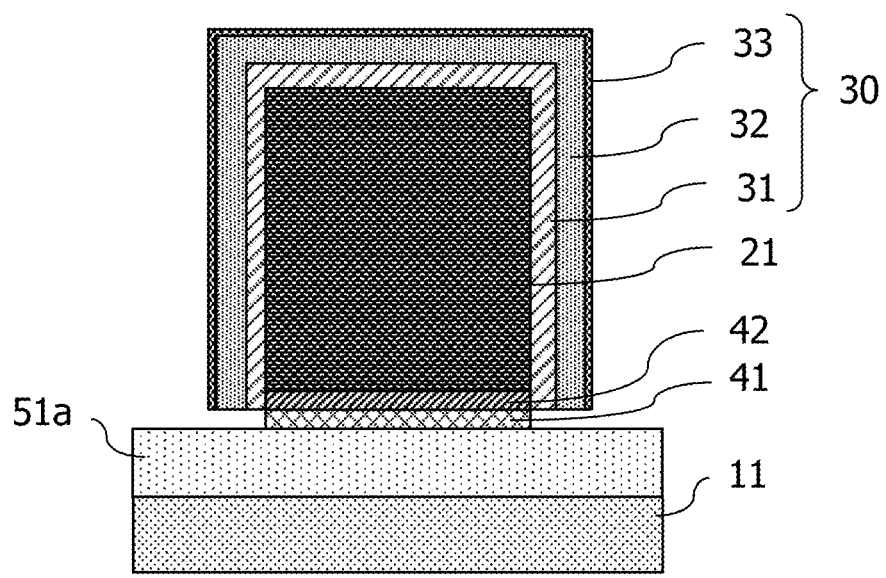
FIG. 3I is a schematic diagram part 9) illustrating the example of a process in the method of manufacturing a wiring board of the present disclosure.

Next, as illustrated in FIG. 3H, electroless plating is performed over the surface of the formed electroless plating film 31' by using a metal containing cobalt (Co) or chromium (Cr) to form the base metal layer 32. After forming the base metal layer 32, heat treatment is performed in a nitrogen (low oxygen) atmosphere at 200° C. for 1 hour, whereby the electroless plating film 31' is thermally diffused into the wiring layer 21 as illustrated in FIG. 3I, and thus the diffusion suppressing layer 31 made of an alloy of the metal component of the wiring layer 21 and the metal of the electroless plating film 31' is formed. At the same time as the formation of the diffusion suppressing layer 31, the exposed surface of the base metal layer 32 is oxidized by the heat treatment, and thus the passivation layer 33 is formed over the surface of the base metal layer 32 as illustrated in FIG. 3I. After the passivation layer 33 is formed, the resin layer 51 is formed around the wiring to protect the wiring, and thus the wiring board illustrated in FIG. 2 is obtained.

EXAMPLES

Hereinafter, examples of the disclosed techniques will be described, but the disclosed techniques are not limited to the following examples.

Example 1

<Manufacture of Wiring Board 1>

A resin material as a base material made mainly of polybenzoxazole (PBO) resin was applied over a Si wafer (corresponding to 11 in FIGS. 3A to 3I) by a spin coating, method and was baked over a hot plate at 110° C. for 2 minutes to form a base resin layer (corresponding to 51a in FIGS. 3A to 3I) having an average thickness of 5 μm. A titanium (Ti) layer having an average thickness of 30 nm was formed by sputtering as an adhesion layer (corresponding to 41 in FIGS. 3B to 3I) over the entire upper surface of the formed base resin layer. Further, a copper (Cu) layer having an average, thickness of 50 nm was formed by sputtering as a power supply layer (corresponding to 42 in FIGS. 3C to 3I) over the entire upper surface of the formed Ti layer. The adhesion layer and the power supply layer may be collectively referred to as a seed layer.

Next, a novolac-type photoresist was applied over the outermost surface of the seed layer of the obtained substrate by a spin coater, and prebaking was performed at a temperature of 100° C. or higher for curing the resist. Thereafter, a photoresist pattern (corresponding to 20a in FIGS. 3D to 3E) was formed by using an exposure apparatus and a developing apparatus. In the photoresist pattern, the width (corresponding to 20b in FIGS. 3D and 3E, width of wiring layer) of a recess portion where the wiring layer was to be formed was set to 2.0 μm, and the width (not illustrated, width between wires) between one recess and another recess was set to 2.0 μm.

Next, the substrate over which the photoresist pattern was, formed was immersed in a copper plating solution having a bath temperature of 30° C., and power was supplied to the substrate to form a wiring layer (corresponding to 21 in FIGS. 3E to 3I) having an average thickness of 1 μm over the exposed power supply layer by electroplating (gloss copper plating). Both the power supply layer and the wiring layer were formed from copper (Cu) and were therefore integrated. Thereafter, the photoresist pattern was removed, the substrate was immersed in a copper etching solution and a titanium etching solution for several minutes, thus the seed layer, the power supply layer, and the adhesion layer in a region not covered by the wiring layer were removed, and thus the substrate (corresponding to FIG. 3F) over which the wiring layer was exposed was obtained.

Next, a substrate over which the wiring layer was exposed was subjected to electroless gold (Au) plating to form a gold (Au) film (corresponding to 31' in FIGS. 3G and 3H) having an average thickness of 2 nm over the exposed surface of the wiring layer. Further, the substrate, over which the gold film was formed was subjected to electroless cobalt-boron (Co—B) plating, and thus a cobalt-boron (Co—B) plating film (corresponding to 32 in FIG. 3H) having an average thickness of 50 nm was formed over the exposed surface of the gold (Au) film. The plated substrate was subjected to heat treatment at 200° C. for 1 hours in an inert oven, then a diffusion suppressing layer (corresponding to 31 in FIG. 3I) of an alloy made of gold-copper (Au—Cu) was formed over the surface layer of the copper wiring layer by diffusing the gold (Au) film and copper (Cu) of the wiring layer, and a passivation layer (corresponding to 33 in FIG. 3I) made of cobalt oxide (Co) was formed over the cobalt-boron (Co—B) plating film (base metal layer, corresponding to 32 in FIG. 3I). After the diffusion suppressing layer and the passivation layer were formed, a resin layer (corresponding to 51 in FIG. 2) was formed around a wire (corresponding to 21 and 31 to 33 in FIG. 3I) made of a wiring layer, a diffusion suppressing layer, a base metal layer, and a passivation layer, and thus a single-layer wiring board 1 was manufactured.

Examples 2 to 6

<Manufacture of Wiring Boards 2 to 6>

Figure 5A:
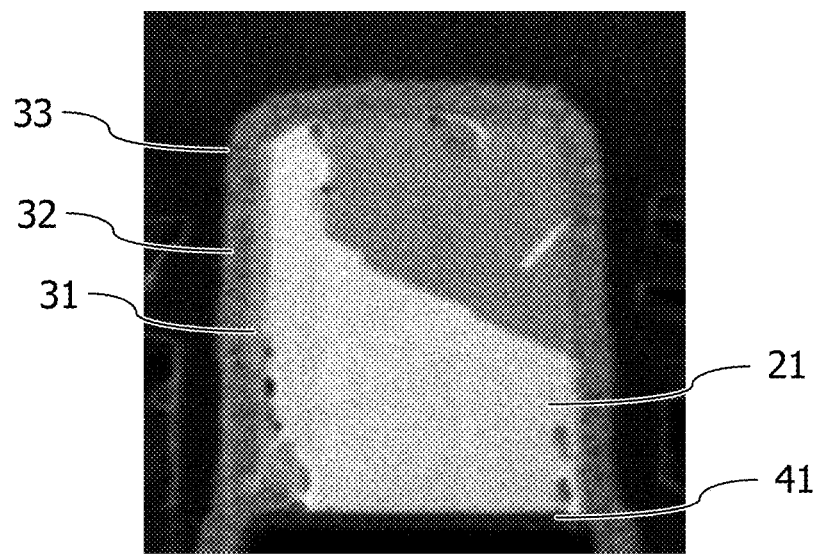
FIG. 5A is an electron micrograph illustrating an example of a cross section of wiring in a wiring board obtained in Example 2.
Figure 5B:
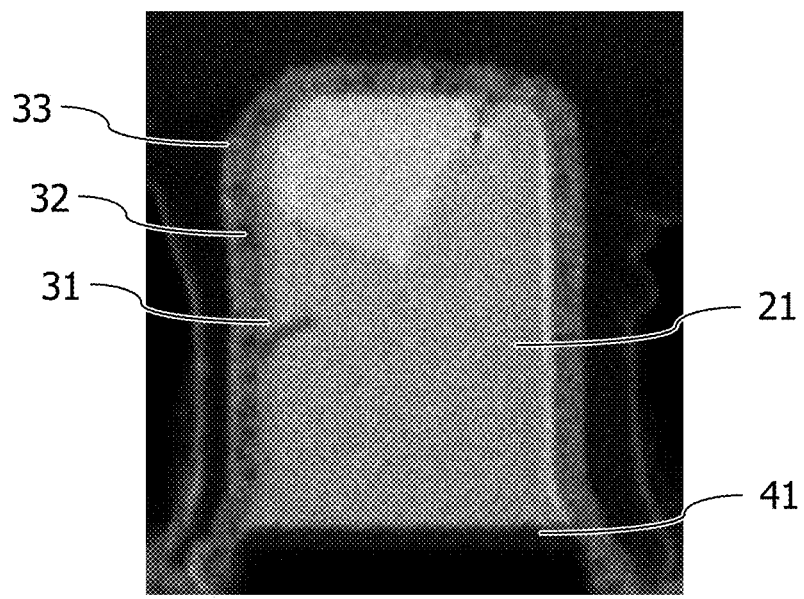
FIG. 5B is an electron micrograph illustrating an example of a cross section of wiring in a wiring board obtained in Example 4.

Wiring boards 2 to 6 were manufactured in the same manner as in Example 1 except that the width (width of wiring layer, L) of the recess portion where the wiring layer was to be formed and the width (width between wires, S) between one recess portion and another recess portion in the photoresist pattern of Example 1 were changed as illustrated in Table 1. FIG. 5A is an electron micrograph of a cross section of a part of the wiring board 2 of Example 2 in which the width of the wiring layer was set to 1.0 μm, and FIG. 5B illustrates an electron micrograph of a cross section of a part of the wiring board 4 of Example 4 in which the width of the wiring layer was set to 0.7 μm. From the results of FIGS. 5A and 5B, it was confirmed that, in the wiring boards 2 and 4, a diffusion suppressing layer of gold-copper (Au—Cu) alloy was formed over the surface of the copper wiring layer to a thickness of about 30 nm, and a base metal layer of cobalt-boron (Co—B) was formed over the surface of the diffusion suppressing layer to a thickness of about 50 nm.

Comparative Example 1

<Manufacture of Wiring Board 7>

In Example 1, after the wiring layer was formed and the photoresist pattern was removed, the substrate was immersed in an activator liquid, and a palladium (Pd) film was formed around the copper wiring layer. Further, a wiring board 7 was manufactured in the same manner as in Example 1 except that the substrate was washed with water, immersed in an electroless Ni—P plating solution, and an electroless Ni—P plating film was formed to a thickness of 50 nm as a barrier metal layer around the copper wiring layer.

Comparative Examples 2 to 6

<Manufacture of Wiring Boards 8 to 12>

Wiring boards 8 to 12 were manufactured in the same manner as in Comparative Example 1 except that the width (width of wiring layer, L) of the recess portion where the wiring layer was to be formed and the width (width between wires, S) between one recess portion and another recess portion in the photoresist of Comparative Example 1 were changed as illustrated in Table 1 similarly to Examples 2 to 6.

TABLE 1

| | Wiring board No. | Wiring width (μm) | Inter-wire width (μm) |
|---|---|---|---|
| Example 1 | 1 | 2.0 | 2.0 |
| Comparative Example 1 | 7 | | |
| Example 2 | 2 | 1.0 | 1.0 |
| Comparative Example 2 | 8 | | |
| Example 3 | 3 | 0.8 | 1.2 |
| Comparative Example 3 | 9 | | |
| Example 4 | 4 | 0.7 | 0.7 |
| Comparative Example 4 | 10 | | |
| Example 5 | 5 | 0.6 | 0.8 |
| Comparative Example 5 | 11 | | |
| Example 6 | 6 | 0.5 | 0.9 |
| Comparative Example 6 | 12 | | |

[Reliability Evaluation of Wiring Board]
<Reliability Test>

Figure 4:
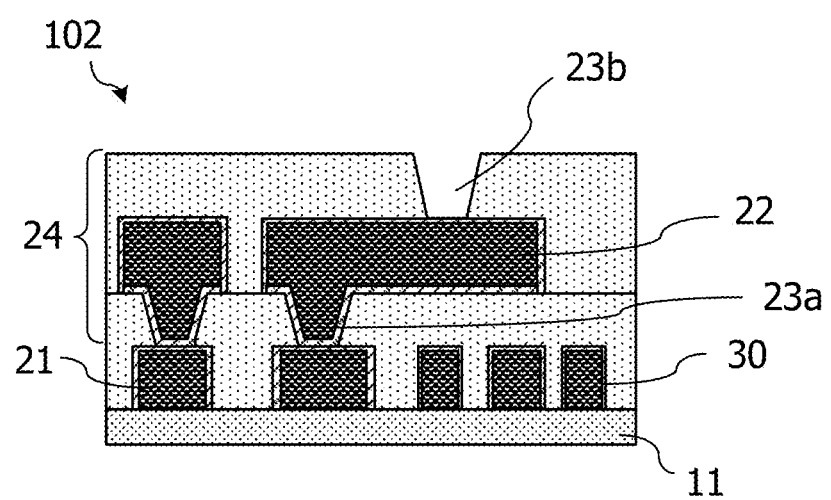
FIG. 4 is a schematic diagram illustrating an example of a structure of a wiring board provided with leader wiring in an example.
Figure 6:
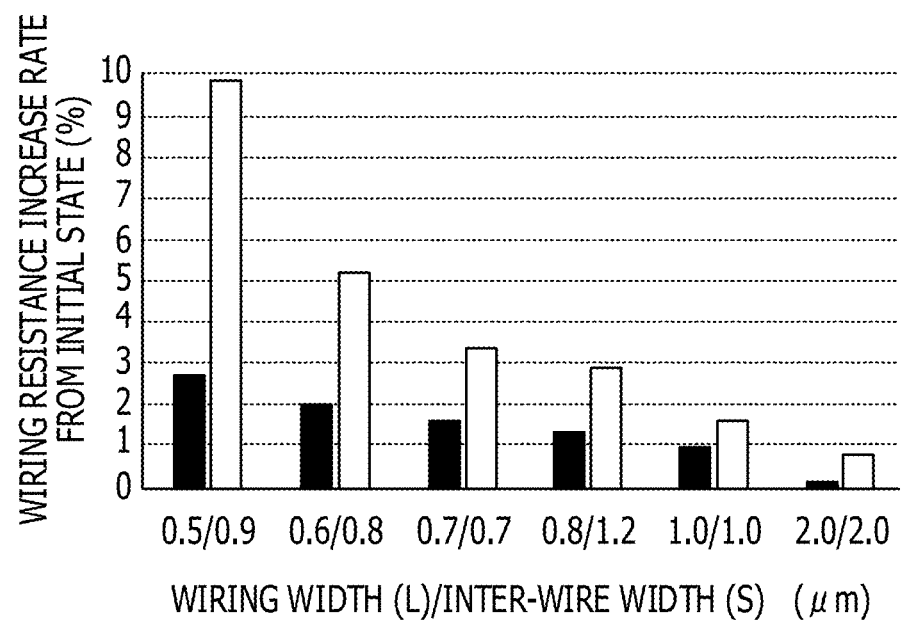
FIG. 6 is a graph illustrating results of reliability tests of wiring boards obtained in Examples and wiring boards obtained in Comparative Examples.

Leader wiring 24 as illustrated in FIG. 4 was formed over the obtained wiring boards 1 to 12, and the wiring resistance value (initial wiring resistance value) of the wiring boards 1 to 12 was measured. Next, a reliability test (JEVEC LEVEL 4) by hygroscopic reflow under the following conditions was performed to measure the wiring resistance value of each of the wiring boards 1 to 12 after the reliability test, and the wiring resistance value after the reliability test with respect to the wiring resistance value (initial wiring resistance value) before, the reliability test of each of the wiring boards 1 to 12 was calculated as a wiring resistance increase rate (%) from the initial state. The results are illustrated in FIG. 6.

The method of forming the leader wiring 24 illustrated in FIG. 4 is as follows. First, a resin layer having a via opening was formed over the wiring (the wiring layer 21 and the barrier metal layer 30 in FIG. 4). Next, a seed layer of titanium (Ti) and copper (Cu) was formed over the entire surface of the resin layer. A photoresist pattern to be a wiring layer 22 of the leader wiring 24 was formed over the seed layer, and a via layer 23a and the wiring layer 22 were formed by electroplating. An electrode for measuring a wiring resistance value was provided in the wiring layer 22. A via layer 23b was formed at the position of the electrode, and wiring other than the electrode was covered by a resin layer. In this manner, the leader wiring 24 was formed.

[Conditions]
(1) to (3) below were carried out in this order.
(1) Drying step: 125° C., 24 hours, thermostatic bath
(2) Moisture absorption step: 60° C., relative humidity of 60%, 40 hours, moisture absorption oven
(3) Reflow process: 3 times of 260° C. peak reflow, reflow furnace The results illustrated in FIG. 6 indicate that, although there is a tendency that the wiring resistance increase rate from the initial stage of measurement increases as the wiring width becomes narrower (finer) in all wiring boards of Examples 1 to 6 and Comparative Examples 1 to 6, the wiring resistance increase rate may be suppressed in the wiring boards of Examples 1 to 6 as compared with the wiring boards of Comparative Examples 1 to 6. For example, in wiring boards 2 and 4 respectively having wiring widths of 1.0 μm and 0.7 μm, it was possible to suppress the wiring resistance increase rate respectively by 2.1 times and 1.67 times with respect to the wiring boards 8 and 10 of Comparative Examples.

As described above, by providing the diffusion suppressing layer of the alloy made of a gold-copper (Au—Cu) compound around the wiring layer, it was possible to suppress thermal diffusion of the metal component of the wiring layer to the barrier metal layer or thermal diffusion of the metal component of the barrier metal layer to the wiring layer, suppress increase in the oxide film (passivation layer) due to heating, and suppress increase in the resistance of the wiring. Even if the wiring width was reduced, for example, even when the wiring was miniaturized, a wiring board capable of ensuring high reliability was realized.

Example 7

<Manufacture of Wiring Board 13>

A wiring board 13 was manufactured in the same manners in Example 1 except that a tin (Sn) film having an average thickness of about 5 nm was formed over the exposed surface of the wiring layer by electroless tin plating instead of electroless gold plating, a cobalt-tungsten (Co—W) plating film was formed to a thickness of about 40 nm over the exposed surface of the tin (Sn) film by electroless cobalt-tungsten (Co—W) plating instead of electroless cobalt-boron plating, and heat treatment was performed by 250° C. peak reflow to diffuse the tin (Sn) film and copper (Cu) of the wiring layer to form a diffusion suppressing layer of an alloy made of tin-copper (Sn—Cu) over the surface layer of the copper wiring layer and to form a passivation layer made of cobalt oxide over the surface of the cobalt-tungsten (Co—W) plating film (base metal layer) in Example 1.

Similarly to Example 1, it was confirmed that the copper-tin (Cu—Sn) alloy serving as a diffusion suppressing layer in the wiring structure of the wiring board 13 of Example 7 also suppressed thermal diffusion of the metal of the copper wiring layer and thermal diffusion of the metal of another layer to the copper wiring layer. Since the average thickness of cobalt oxide (CoO) serving as the passivation layer did not change since the formation of the passivation layer even after the reliability test, the increase in the oxide film was suppressed and increase in the resistance value of the wiring was suppressed to a low level. As described above, by providing the wiring structure of the wiring board of the present disclosure, the increase in the resistance of the wiring may be suppressed, and a wiring board having high reliability may be realized. Further, even if the wiring width, is reduced, for example, even when the wiring is miniaturized, a wiring board capable of ensuring high reliability may be realized.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A wiring board comprising: a wiring layer: a diffusion suppressing layer that covers the wiring layer and suppresses diffusion of a metal component of the wiring layer; a base metal layer that covers the diffusion suppressing layer; and a passivation layer that covers the base metal layer, wherein the base metal layer contains at least one of Co and Cr, and wherein the passivation layer is an oxide film of the base metal layer.

2. The wiring board according to claim 1, wherein the diffusion suppressing layer is made of an alloy containing a metal component of the wiring layer.

3. The wiring board according to claim 1, wherein a width of the wiring layer is 1.0 µm or less.

4. A method of manufacturing a wiring board, the method comprising: forming a wiring layer over a substrate; forming a diffusion suppressing layer that covers the wiring layer and suppresses diffusion of a metal component of the wiring layer; forming a base metal layer that cavers the diffusion suppressing layer; and forming a passivation layer that covers the base metal layer, wherein the base metal layer contains at least one of Co and Cr, and wherein the passivation layer is an oxide film of the base metal layer.

5. The method according to claim 4, wherein the diffusion suppressing layer is made of an alloy containing a metal component of the wiring layer.

6. The method according to claim 4, wherein a width of the wiring layer is 1.0 µm or less.

* * * * *